United States Patent [19]

Kleinhans et al.

[11] Patent Number: 4,528,062

[45] Date of Patent: Jul. 9, 1985

[54] METHOD OF MANUFACTURING A SINGLE CRYSTAL OF A III-V COMPOUND

[75] Inventors: Michel Kleinhans, Mondeville; Michel Gaffre, Caen, both of France

[73] Assignee: U.S. Philips Corporation, New York, N.Y.

[21] Appl. No.: 431,888

[22] Filed: Sep. 30, 1982

Related U.S. Application Data

[63] Continuation of Ser. No. 244,582, Mar. 17, 1981, abandoned, which is a continuation of Ser. No. 9,209, Feb. 5, 1979, abandoned.

[30] Foreign Application Priority Data

Feb. 9, 1978 [FR] France ................. 78 03631

[51] Int. Cl.$^3$ ............................................. C30B 25/00
[52] U.S. Cl. ............................... 156/611; 156/DIG. 70
[58] Field of Search .................... 156/609–611, 156/613, DIG. 70, DIG. 81; 148/174, 175, 1.5; 75/134 P, 134 T

[56] References Cited

U.S. PATENT DOCUMENTS

| | | | |
|---|---|---|---|
| 2,944,975 | 7/1960 | Folberth | 75/134 T |
| 3,322,501 | 5/1967 | Woodall | 75/134 P |
| 3,480,394 | 11/1969 | Merkel et al. | 75/134 P |
| 3,520,810 | 7/1970 | Plaskett et al. | 156/DIG. 70 |
| 3,649,192 | 3/1972 | Deyris | 75/134 P |
| 3,690,846 | 9/1972 | Akai et al. | 23/294 |
| 3,725,284 | 4/1973 | Touchy | 148/1.5 |
| 3,877,883 | 4/1975 | Berkman et al. | 156/DIG. 70 |
| 4,119,704 | 10/1978 | Jacob et al. | 423/299 |
| 4,172,756 | 10/1979 | Hollan | 156/614 |

FOREIGN PATENT DOCUMENTS 46-26201  7/1971  Japan ................. 156/DIG. 70

Primary Examiner—Hiram H. Bernstein
Attorney, Agent, or Firm—Norman N. Spain

[57] ABSTRACT

A method of manufacturing a single crystal of a III-V compound by melting a charge of polycrystalline material and progressive crystallization of the molten stoichiometric compound in a closed space.

The method is characterized in that on the one hand a certain quantity of the sparingly volatile element of the compound is added to the charge of polycrystalline material, which facilitates the melting of the material and on the other hand the corresponding quantity of the volatile element is added at the point of lower temperature of the space so that the stoichiometric ratios are observed.

5 Claims, 3 Drawing Figures

METHOD OF MANUFACTURING A SINGLE CRYSTAL OF A III-V COMPOUND

This is a continuation of application Ser. No. 244,582, filed Mar. 17, 1981 and now abandoned. Said Application Ser. No. 244,582 in turn being a continuation of Application Ser. No. 009,209, filed Feb. 5, 1979 and now abandoned.

BACKGROUND OF THE INVENTION

The invention relates to a method of manufacturing a semiconductor single crystal of a III-V compound which consists essentially of a first element which is comparatively volatile as compared with a second element. This method comprises a first step in which a quantity of a semiconductor III-V compound in polycrystalline form is heated to its molten form by raising the temperature of a first heating zone of a furnace, the said quantity of the III-V compound being placed in a boat in a closed space in which a given pressure of the first element is maintained by means of a quantity of the comparatively volatile element which initially is placed at a given point of the said space, at lower temperature, opposite to a second heating zone, followed by a second step in which the melting bath of the stoichiometric mixture is caused to crystallize progressively, by moving the said boat relative to the temperature profile of the said first zone towards less high temperatures.

A method of this type is one of the most frequently used for the preparation of single crystals of gallium arsenide. It is known as "horizontal Bridgman" process. In the process the crystallization of the semiconductor compound is determined by a slow horizontal displacement of the furnace in which the desired temperature profile is maintained between the heating zones is maintained. There is also a modified embodiment of this method, also known as "gradient freeze", in which the boat and furnace assuming a fixed position relative to each other, the crystallisation is obtained by a progressive modification of the temperature profile of the furnace.

These methods are well known in the semiconductor industry and a description thereof is to be found, for example, in the article of A. R. Von Neida en J. W. Nielsen, entitled "Synthesis and Crystal growth of GaAs and GaP for Substrates" published in Solid State Technology, April 1974, pp. 90 and 91. In the same article there is also described a method of synthesising GaAs which, while using substantially the same apparatus, is distinguished by the fact that the starting materials consist of separate elements of the compound, namely gallium and arsenic. These are introduced respectively, on the one hand in the boat and on the other hand at the point of lower temperature of the space. The synthesis is then carried out by reaction of arsenic vapour and gallium which is brought to a temperature which is slightly higher than the melting point of GaAs. The crystallisation phase of the compound then progresses in the same manner as in the first-mentioned method, that is to say the crystallisation method starting from a batch of molten polycrystalline material.

As regards the efficiency of this method, there should be distinguished between the yield in weight of obtained raw material and the yield in weight of single crystal which can be used for the manufacture of the devices. The yield in weight of raw material is very high in all cases and is near 100%. The yield of the resultant single crystal on the contrary varies according to various factors, in particular: the quality of the apparatus used, the methods used and certain undetermined causes, so that in general this yield is significantly lower than unity.

In the case in which there is synthesis of the compound succeeded by crystallisation in the absence of a monocrystalline seed, the possibilities of obtaining a single crystal are comparatively small.

SUMMARY OF THE INVENTION

Applicant's experience demonstrates that it is possible to use a monocrystalline seed during the synthesis-crystallization operation provided that measures be taken to prevent the dissolution of the seed by the gallium during the rise in temperature, during which phase the synthesis of the compound takes place. In that case the yield by weight of single crystals obtained may be estimated to be on an average in the order of 50%. The causes of this poor yield are the polycrystalline form of the material, the excessive density of the dislocations or the accumulation of dislocations in so-called "lineages" and, to a smaller extent, a concentration of impurities beyond the desired tolerances. Whether the operation synthesis-crystallization is carried out with or without a single crystal seed, one is generally apt to use in some way or another the crystallisation method by melting a quantity of polycrystalline material, either because one counts mainly on this latter method of obtaining the desired single crystal, or because the comparatively expensive materials which are rejected after a crystallisation operation are to be used again.

After repeated observations, Applicants have established that the average yield by weight of single crystal during the crystallisation by melting a quantity of polycrystalline material is considerably smaller than that of the operation synthesis-crystallisation in the presence of a seed.

It was observed in addition that the melting phase of a quantity of polycrystalline material requires a prolonged heating of the contents of the boat at a temperature higher than the melting temperature of the compound, which had detrimental results for the subsequent crystallisation, for example, damage to the boat or its inner coating and/or the appearance of foam at the surface of the melting bath.

The present invention constitutes an improvement of the method of crystallisation by melting a quantity of polycrystalline material and has for its special object to mitigate the above-mentioned disadvantages. According to the invention, the method of manufacturing a semiconductor single crystal of a III-V compound consisting essentially of a first element which is comparatively volatile as compared with the second element, comprises a first step in which, by raising the temperature of a first heating zone of a furnace, a quantity of semiconductor compound in a polycrystalline form is melted, in which step the said quantity is placed in a boat in a closed space in which a certain pressure of the said first element is maintained by a quantity of first said element which initially is placed in the said space at a point of lower temperature opposite a second heating zone, followed by a second step in which by displacement of the said boat relative to the temperature profile of the said first zone towards lower temperatures the melting bath with the stoichiometric mixture is caused to crystallize progressively, is characterized in that in a step preceding the said first step on the one hand a significant quantity of the second less volatile element is added to the boat with the compound in polycrystalline form and on the other hand, at a temperature which is lower than that of the said space, a quantity of the same element which, from a stoichiometric point of view, is complementary to the said significant quantity of the said second element is added in addition to the said quantity of the first element, after which, during the first step, the rise in temperature of the said second heating heating zone relative to the rise in temperature of the said first zone is controlled so that the incorporation of the added quantity of the said first element to the melting bath containing the addition of the said second element remains insufficient during the greater part of said step to cause in itself the saturation of the said melting bath so that the said quantity of semiconductor compound goes progressively and completely into solution in the said melting bath during the said first step.

The expression "significant quantity" is to be understood to mean herein a quantity which is not so small as to be negligible with respect to the weight of the semiconductor compound crystallized in the method but also is not so large as to substantially determine the said weight by synthesis.

The said complementary quantity of the first element is of course that which can easily be calculated as that which in combination with the said significant quantity of the second element must produce a stoichiometric composite body.

Experience has demonstrated that the abovementioned control of the rise in temperature of the said second zone was easy to realize. It is known that the temperature of the said second zone determines the evaporation degree of the said first element and consequently the rate of incorporation in the melting bath. If the furnace has an inspection window, which generally is the case, too rapid a dissolution of the polycrystalline material or the added quantity of the second element can easily be observed, which then means that the rate of evaporation of the said first element may be accelerated by a rise in temperature of the said second heating zone, whereas, if too slow a dissolution of the quantity of polycrystalline material is observed, this means that the evaporation of the said first material at that instant is too large and that the temperature of the said second heating zone must temporarily be kept stable (if not reduced) awaiting a larger dissolving power of the bath which it will obtain when it reaches a higher temperature.

Thus a considerable part of the quantity of polycrystalline material is already dissolved in the melting bath when this bath reaches the stabilisation temperature of the said first zone during the said first step of the method, which temperature furthermore is slightly higher than the melting temperature of the composite semiconductor compound. Moreover, obtaining the total quantity of polycrystalline material in a liquid form occurs more rapidly after the stabilization of the temperature in question has been reached.

So the method according to the invention has the great advantage of enabling the melting of the polycrystalline material during a heating cycle which has a minimum duration at high temperature. The gain in time as compared with the prior-art method of crystallization by melting a quantity of polycrystalline material is considerable.

Because the boat is not exposed to high temperatures for a long time, it will not be damaged nor experience a considerable attack of its walls or its coating. The melting bath is not affected by the presence of foam so that the subsequent crystallisation operation can be carried out in excellent circumstances.

For the introduction of the progressive crystallisation of the material a monocrystalline seed is preferably used and the method of manufacturing the single crystal according to the invention therefore has a significantly improved yield.

The significant quantity of the said second relatively non-volatile material which is added to the quantity of polycrystalline material preferably corresponds in weight to more than 3% and less than 40% of the ultimate crystallized semiconductor compound.

In fact, the advantages of the method of the invention are fully achieved under these conditions.

According to a preferred embodiment of the method, for the initial charge of the boat, the said second relatively non-volatile element is located substantially in a central place in the boat, while parts of the said quantity of polycrystalline material are placed on either side thereof. In another embodiment of charging the boat, the addition of the said second relatively non-volatile element is divided into at least two portions adjoining portions of the said quantity of the compound in polycrystalline form. In fact, these two embodiments of the method are favourable because they provide an increase of the contact area between the addition of the said second element which is liquid from the beginning of the first phase of the method, and the parts of the quantity of polycrystalline material which initially are in the solid state. As a result, the dissolution of the solid parts by the bath is accelerated.

BRIEF DESCRIPTION OF THE DRAWINGS

The method according to the invention is preferably used for the manufacture of gallium arsenide.

The invention will be described in greater detail with reference to the accompanying figures.

DETAILED DESCRIPTION OF THE INVENTION

The invention will now be described in greater detail with reference to the drawings.

Figure 1:
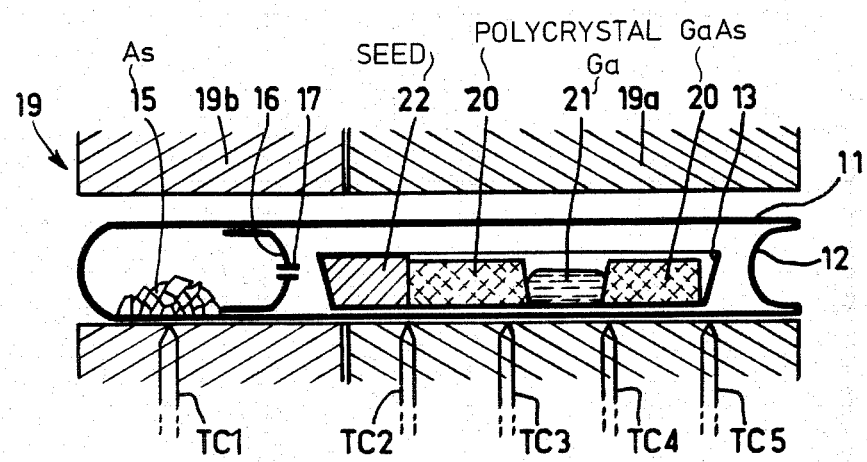
FIG. 1 is a diagrammatic sectional view of an apparatus which may be used for carrying out the method according to the invention in the state at the beginning of the first step of the method.

As shown in FIG. 1, the device for manufacturing semiconductor single crystals of III-V compounds, and more in particular of gallium arsenide, mainly comprises a tubular container 11 of quartz which is sealed by a sealing member 12 likewise of quartz. Inside the container 11 are placed at one end a boat 13 of quartz in which the final crystallization of the single crystal is to be carried out and at the other end near the end of the container 11 opposite the sealing member 12 a certain quantity of arsenic 15. A diaphragm 16 formed by a quartz tube having a small central aperture 17 is placed between the quantity of arsenic 15 and the boat 13 so as to control the transport of the evaporated arsenic towards the boat 13. The container 11 is placed within a furnace 19 in such manner that the greater part of the boat 13 is present opposite a first heating zone 19a a which is to melt the compound, while the quantity of arsenic 15 is positioned so as to be opposite of a second heating zone 19b the temperature of which is considerably lower than that of the zone 19a. Thermocouples shown diagrammatically at TC1, TC2 ... to TC5 complete the device and provide the necessary data for the adjustment of the temperature profiles according to the longitudinal axis of the apparatus, which profiles are desired for the various steps of the method.

Before the boat is placed in the container 11 it is provided with a charge 20 of polycrystalline gallium arsenide to which, according to the invention, a significant quantity of gallium 21 has been added. That is a quantity of gallium 21 which is not negligible with respect to the charge 20 of the polycrystalline gallium arsenide but otherwise is not so large that it is the charge 20 of the crystalline material which is negligible with respect to said quantity of gallium. In the example described and shown in the FIG. 1 the significant quantity of gallium 21 is provided substantially in a central position of the boat 13 while the said charge 20 of polycrystalline gallium arsenide is divided into substantially equivalent parts which are placed one on each side of the quantity of gallium 21. By proceeding in this manner a large contact area is obtained between the charge 20 of polycrystalline material and the significant quantity of gallium 21 which facilitates a rapid dissolution of the charge 20 in the melting bath during the phase of the rise in temperature.

In the preferred embodiment of the method embodying the invention now described the charging of the boat 13 is completed with the addition a monocrystalline seed 22 oriented according to a given crystallographic direction. With respect to the mutual positions of the monocrystalline seed 22 and the significant quantity of gallium 21 it is to be noted that it is desirable not to place these beside each other so that a premature dissolution of the monocrystalline seed 22 during the first phase of the method is avoided.

The quantity of arsenic 15 is determined as follows: it comprises on the one hand the complementary quantity of the significant quantity of gallium 21, that is to say the weight which is strictly necessary to obtain the stoichiometric compound with the said significant quantity of gallium 21, on the other hand it comprises an extra supply calculated starting from the effective volume of the space 11 and of the temperature of the zone 19b which is kept substantially constant during the whole phase of the method which relates to the progressive crystallisation of the gallium arsenide material. This extra supply permits of obtaining in the container 11 a vapour pressure of arsenic which counteracts the dissociation of the gallium arsenide at a temperature near the melting temperature of the said compound.

By way of illustration, one of Applicants' experiments has been carried out in the following conditions: the container 11 had a diameter of 60 mm and a length of approximately 0.70 m. In this container 11 a boat 13 had been provided having a trapezoidal cross-section and a length substantially equal to 0.25 m. The boat 13 was charged with 480 g of polycrystalline GaAs 20 and 250 g of gallium 21. The quantity of arsenic 15 was 273 g composed of 268.65 g, which is the complementary quantity of the 250 g of gallium 21 from a stoichiometric point of view, and an extra supply of 4.35 g for providing in the container 11 an arsenic vapour pressure of substantially 1 atmosphere when the zone 19b the is heated at a temperature of 625° C. during the process.

Figure 2:
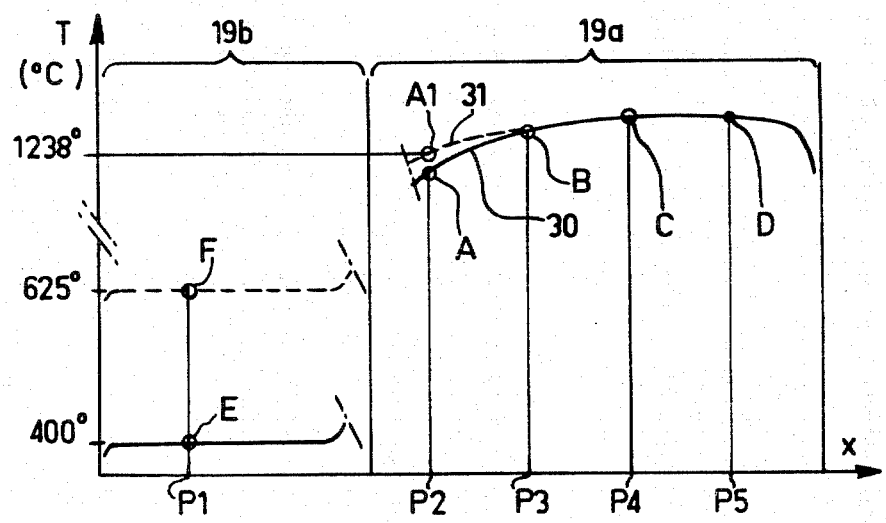
FIG. 2 shows temperature diagrams according to the longitudinal axis of the apparatus shown in FIG. 1 at various instants of the method.

The operations were carried out as follows: during a first step the furnace 19 is heated in a manner such that the zone 19a at the end of the first phase of said step reaches the temperature profile indicated by the curve 30 of FIG. 2 and that zone 19b reaches a temperature of 400° C. In FIG. 2 the positions on the longitudinal axis of the furnace of FIG. 1 are shown according to a horizontal axis. The positions of the thermocouples TC1, TC2 ... TC5 are shown at P1, P2, ... P5, respectively, the diagram of FIG. 2 indicating the prescribed temperature of the heating control devices (not shown in the drawing) which are connected to the respective thermocouples and which act on each of the heating parts of which the assembly forms the zones 19a and 19b.

In point A of curve 30 of the diagram shown in FIG. 2 it is to be noted that the prescribed temperature is lower than the melting temperature of GaAs (1238° C.), while in points B, C and D the prescribed temperatures are higher. This measure ensures the integrity of the seed 22 during said phase of the operation. It takes approximately 25 minutes from the instant of bringing the furnace 19 at temperature before the temperatures indicated by curve 30 of FIG. 2 are reached. The temperature of 400° C. on the contrary is obtained in the point P1 on the horizontal axis (point E of the diagram) in a much shorter period of time and this temperature is maintained at this value for the whole of the zone 19b. The quantity of arsenic 15 which is exposed to the temperature of the zone 19b and hence totally is very near to 400° C. shows a small degree of evaporation so that the pressure inside the container 11 is still far below 1 atmosphere. Because the melting bath contains little arsenic originating from the quantity 15 the charge 20 of polycrystalline gallium arsenide dissolves very rapidly and from that instant on the zone 19a is heated above 800° C. Since the furnace 19 has an inspection window (not shown in the drawing) a reasonable dissolving rate of the charge 20 of the polycrystalline gallium arsenide can easily be ensured, parts of the quantity of arsenic being progressively incorporated in the melting bath in the boat 13 according as the temperature rises. This is done by carrying out a progressive rise in temperature of the heating zone 19b, for example, by successive temperature steps of 20° C., which are indicated on the control device which is connected to the thermocouple TC1. This is continued in the point P1 of the horizontal axis of the diagram of FIG. 2 until the temperature has reached a value of 625° C. (point F of the diagram), which value is then kept constant during the remainder of the method. After the prescribed temperatures of the heating zone 19a (curve 30) have been reached and all the materials in the boat 13 have melted with the exception of the monocrystalline seed 22, the temperature of the heating part of the zone 19a is further increased which is controlled by the thermocouple TC2 so that the melting temperature of the gallium arsenide compound is reached at the point P2 of the horizontal axis (point A1 of the curve 31) so that a part of the monocrystalline seed 22 starts melting. When the situation thus described has been stabilised, the first step of the method, which has lasted approximately 40 minutes since the heating of the furnace, is terminated and the melting bath may be crystallized progressively in the second step, the melting bath consisting of the stoichiometric mixture of the elements of the compound.

This step of the method is well known in the art: it consists of the progressive and controlled decrease of the temperature of the separation zone between solid and liquid. This is obtained by a displacement relative to the boat 13 of the temperature profile in the proximity of point A1 and can be realised by moving the container 11 in the direction of the zone 19b, or, as in the case described, by a programmation by progressive cooling of successively the parts of the heating zone 19a, start being made with the part which is controlled by the thermocouple TC2, then the adjoining part which is controlled by the thermocouple TC3, and so on.

When the method according to the invention in the example described is compared with that according to the prior art which consists of the mere use of a charge of polycrystalline material of approximately 1000 g, which is treated in the same apparatus, it will be obvious that the method according to the invention is very favourable. In fact, the duration of the first step has been reduced by approximately 2 hours, which means a very appreciable gain in time and energy. Furthermore, the maximum temperatures necessary for the hottest zone of the furnace are 15° to 25° C. lower in the method according to the invention, which on the one hand extends the life of the heating elements of the furnace and on the other hand protects the material and especially the parts of quartz which are in the immediate proximity of the treated semiconductor material. This explains the established advantage that the material produced is purer and is obtained in a monocrystalline form in a higher yield than with the prior art method.

Figure 3:
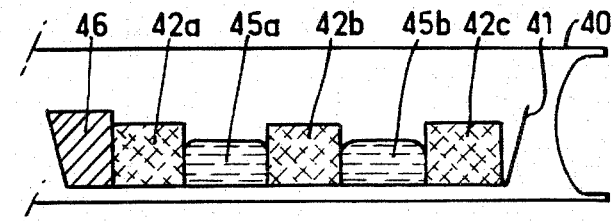
FIG. 3 is a sectional view of a part of the apparatus shown in FIG. 1 in a modified embodiment of the way of charging the boat during the method according to the invention.

FIG. 3 shows a modified embodiment of the way of charging the boat in the method according to the invention. The boat 41 containing the material to be melted is placed in the container 40. According to this embodiment the charge of polycrystalline gallium arsenide is divided into three portions 42a, 42b, 42c. The significant quantity of gallium which is added according to the method of the invention is divided into two portions 45a and 45b which are provided in the boat alternately with the parts 42a, 42b, 42c so that these adjoin each other. The monocrystalline seed 46 is placed beside a portion 42 of the charge of polycrystalline gallium arsenide in such manner as to be protected against a premature dissolution during the first step of the method. The subdivision of the addition of gallium according to the invention as just described or the division into a larger number of portions is favourable because the dissolution of the solid parts by liquid parts during the step of the rise in temperature is facilitated and the duration and the final temperature of said step of the method are minimized.

The question of incorporating a doping impurity in the material in a sufficient quantity to obtain in the single crystal a concentration between certain limits can easily be solved by those skilled in the art. When the segregation coefficient which is proper to the impurity in question and which in most of the cases is of a low value, is taken into account, it should be considered that the large quantity of the impurities introduced during the crystallization operation proves to be localized in the part of the crystal crystallized last. This part of a few cms lengths is known as "quence" of the rod. Consequently, in the usual case in which single crystals having a concentration between fixed limits are to be obtained repeatedly, only a "quence" of the rod doped with the same impurities is to be introduced as a charge of polycrystalline material. Experience proves that by the addition of a small quantity of impurities a concentration satisfying the requirements is easily obtained in the crystals. An alternative consists in omitting any already doped "quence" of a rod from the charge of polycrystalline material; the material of said charge may then be mixed with a clean material and the required quantity of impurity may be introduced in the case pure materials are used or a slightly smaller quantity which can easily be evaluated.

The following results have been obtained during a series of tests and they are shown here by way of example: during the crystallisation of a quantity of 1000 g of GaAs from pure elements, 40 mg of silicon have been added in the boat and a block is obtained the greater part of which has a concentration between $7.10^{17}$ cm$^{-3}$ and $2.10^{18}$ cm$^{-3}$, with the exception of a more concentrated "quence" having a length of 2 cm. During another test using the method according to the invention and relating to the crystallisation of a block of 1000 g of GaAs starting for one half from a charge of polycrystalline material having a "quence" of a silicon-doped block obtained previously, and for the other half of separated elements: gallium and arsenic, only 10 mg of silicon have been added and a block is obtained the concentration of which was substantially near that of the block of the first test.

Furthermore, another particular advantage of the method according to the invention is to be noted when this is used by choosing, for the charge, weight ratios of material which in the operation are in proportion to the average yield by weight of the resulting single crystal. More particularly, when the sum of the weights of the two added elements with respect to the overall weight of the treated material is chosen to be so as to lie near the endeavoured average yield it is possible to operate repeatedly in identical conditions. This is favourable from several points of view and in particular for the accurate knowledge and application of automated temperature programmes during the first step of the method.

Although the invention has been described with reference to a specific example of crystallisation of gallium arsenide in a horizontal apparatus of the "gradient freeze" type, it will be obvious that it is not restricted to this form of application. The method according to the invention on the contrary is generally used to manufacture semiconductor single crystals of III-V compounds consisting of a first element which is comparatively volatile as compared with a second element. The type of apparatus used is not important in this respect and the variations of the method described fall within the scope of the present invention in as far as the measures described in the invention are used.

What is claimed is:
1. A method of manufacturing a semiconductor monocrystal of a III-V compound, which compound consists of a first, relatively volatile element, and a second, relatively non-volatile, element, said method comprising:
(a) placing a quantity of a polycrystalline form of said III-V compound together with a significant amount of said second, relatively non-volatile element in a first portion of a closed space in a first heating zone of a furnace,
(b) placing in a second portion of said closed space, and in a second heating zone of said furnace, a quantity of said first, relatively volatile element sufficiently in excess of the stoichiometric quantity thereof required to react with said amount of said second, relatively non-volatile element to provide a vapor pressure of said relatively volatile element, in said closed space, sufficiently large to counteract the dissociation of said III-V compound at a temperature approximately that of the melting point of said III-V compound, (c) raising the temperature of said first heating zone sufficiently to dissolve said polycrystalline semiconductor III-V compound in said second, relatively non-volatile element, but below the melting point of said III-V compound, heating while raising the temperature of said second heating zone to a point sufficiently high to cause the formation and maintenance of a vapor pressure of said first, relatively volatile element in said closed space but insufficient to cause saturation of the resultant solution of said dissolved polycrystalline III-V compound by the compound formed by the reaction of the vapors of the relatively volatile first element with said relatively non-volatile second element present in said solution, (d) maintaining the resultant temperature differential between said first and second heating zones until most of said second, relatively non-volatile, element in which said molten polycrystalline III-V compound is dissolved is reacted with said relatively, first element, (e) slowly increasing the temperature of second heating zone to bring the temperature of said relatively volatile first element to the melting point of said first element for a time sufficient to cause said first, relatively volatile, element to combine with the remainder of said second, relatively non-volatile element in which said III-V polycrystalline compound is dissolved, (f) increasing the temperature of said first heating zone to the melting point of said III-V compound, and (g) crystallizing said resultant liquid phase by decreasing the temperature profile of said liquid phase.

2. A method as claimed in claim 1, characterized in that the significant quantity of the said second relatively non-volatile element which is added to the quantity of the compound in polycrystalline form corresponds in weight to more than 3% and less than 40% of the ultimate, monocrystallized semiconductor compound.

3. A method as claimed in claim 1 or 2, characterized in that a monocrystalline seed is used to induce the progressive crystallisation.

4. The method of claim 3 wherein the second relatively non-volatile element is positioned between substantially equal portions of the III-V polycrystalline compound.

5. The method of claim 3 wherein the second relatively non-volatile element is divided into at least two portions adjoining portions of similar quantities of the III-V polycrystalline compound.

* * * * *

UNITED STATES PATENT AND TRADEMARK OFFICE
CERTIFICATE OF CORRECTION

PATENT NO. : 4,528,062

DATED : July 9, 1985

INVENTOR(S) : MICHEL KLEINHANS et al

It is certified that error appears in the above—identified patent and that said Letters Patent is hereby corrected as shown below:

In the Claims;

Column 10, Line 21 delete "progressive".

Signed and Sealed this

Fifth Day of November 1985

[SEAL]

Attest:

Attesting Officer

DONALD J. QUIGG

Commissioner of Patents and Trademarks